(12) United States Patent
Choi et al.

(10) Patent No.: US 7,179,739 B2
(45) Date of Patent: Feb. 20, 2007

(54) METHODS OF FORMING A SEMICONDUCTOR DEVICE INCLUDING A METAL SILICIDE LAYER BETWEEN A CONDUCTIVE PLUG AND A BOTTOM ELECTRODE OF A CAPACITOR

(75) Inventors: Jeong-Sik Choi, Seoul (KR); Jung-Hee Chung, Seoul (KR); Woo-Gwan Shim, Gyeonggi-do (KR); Young-Sun Kim, Gyeonggi-do (KR); Jae-Hyoung Choi, Gyeonggi-do (KR); Se-Hoon Oh, Gyeonggi-do (KR); Cha-Young Yoo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 129 days.

(21) Appl. No.: 10/863,828

(22) Filed: Jun. 8, 2004

(65) Prior Publication Data
US 2005/0020066 A1    Jan. 27, 2005

(30) Foreign Application Priority Data
Jul. 22, 2003    (KR) ...................... 10-2003-0050125

(51) Int. Cl.
*H01L 21/44*    (2006.01)
(52) U.S. Cl. ................................ 438/656; 257/E21.438
(58) Field of Classification Search ................ 438/683, 438/672, 682, 652, 656, 657; 257/E21.438
See application file for complete search history.

(56) References Cited

U.S. PATENT DOCUMENTS 5,381,302 A * 1/1995 Sandhu et al. .............. 361/305
5,851,917 A * 12/1998 Lee ............................. 438/627
6,284,641 B1 * 9/2001 Parekh ........................ 438/618
6,455,370 B1   9/2002 Lane .......................... 438/253
2004/0009615 A1 * 1/2004 Schuele et al. ................ 438/3
2004/0211997 A1 * 10/2004 Oh et al. ..................... 257/295

FOREIGN PATENT DOCUMENTS

| KR | 2002-84596 | 11/2002 |
|---|---|---|
| KR | 2003-0002129 | 1/2003 |
| KR | 2003-0045470 | 6/2003 |

OTHER PUBLICATIONS

Notice to File a Response/ Amendment to the Examination Report for Korean patent application No. 10-2003-0050125 mailed on May 31, 2005.

* cited by examiner

*Primary Examiner*—Bradley K. Smith
(74) *Attorney, Agent, or Firm*—Myers, Bigel, Sibley & Sajovec

(57) ABSTRACT

Embodiments of the present invention include methods of forming a contact to a capacitor in a semiconductor device. A metal silicide layer is formed at a top surface of a conductive plug of the semiconductor device that is coupled to a bottom electrode of the capacitor to provide an ohmic contact therebetween. Forming a metal silicide layer may include exposing a surface of the conductive plug, depositing a metal layer of the bottom electrode on the exposed surface of the conductive plug and thermally processing the semiconductor device to react a part of the deposited metal layer and the conductive plug to form the metal silicide layer. Methods of forming a semiconductor device including a capacitor having a metal silicide layer connecting a bottom electrode of the capacitor and a conductive plug are also provided.

21 Claims, 14 Drawing Sheets

METHODS OF FORMING A SEMICONDUCTOR DEVICE INCLUDING A METAL SILICIDE LAYER BETWEEN A CONDUCTIVE PLUG AND A BOTTOM ELECTRODE OF A CAPACITOR

CLAIM OF PRIORITY

This application claims priority from Korean Patent Application No. 2003-50125, filed on Jul. 22, 2003, in the Korean Intellectual Property Office, the disclosure of which is hereby incorporated herein by reference.

BACKGROUND OF THE INVENTION

The present invention generally relates to methods of forming semiconductor devices. More particularly, the present invention relates to methods of forming semiconductor devices having capacitors including electrodes comprising metal.

A capacitor in an integrated circuit (semiconductor) device typically includes a bottom electrode, an upper electrode and a dielectric layer interposed between the bottom electrode and the upper electrode. Such a capacitor may be used, for example, in a data-storing memory cell or as part of a logic circuit. As semiconductor devices become highly integrated, the size of capacitors included in the device are generally reduced, which may decrease the capacitance of the capacitors.

In some integrated circuits, the bottom electrode and the upper electrode of a capacitor may be conventionally formed of polysilicon doped by impurities and the dielectric layer may be conventionally formed of silicon oxide and/or an oxide-nitride-oxide (ONO) layer. A native oxide layer may be formed on the polysilicon doped by impurities. The capacitance of the capacitor may be decreased due to the native oxide layer because the native oxide layer may increase an overall thickness of the dielectric layer. Accordingly, various investigations have been undertaken directed to increasing capacitance while decreasing physical planar area of a capacitor.

One area of investigation is metal-insulator-metal (MIM) capacitors wherein the bottom electrode and the upper electrode are formed as metal layers. A MIM capacitor may store more charge than a capacitor using electrodes of a polysilicon doped by impurities as the use of metal may prevent the formation of the native oxide layer. Furthermore, the MIM capacitor may employ a high-k dielectric layer having a higher dielectric constant (k) than the ONO layer described above for the doped polysilicon electrode capacitor. Thus, capacitance of the MIM capacitor may be increased. The MIM capacitor may be used, for example, in a data-storing memory cell of a dynamic random access memory (DRAM) device and/or a ferroelectric memory device.

However, a bottom electrode of the MIM capacitor may be disposed on a conductive plug formed of a polysilicon doped by impurities. As such, due to a difference of a work function between the bottom electrode of metal and the conductive plug of polysilicon, a contact resistance therebetween may be increased. As one approach to avoiding this problem, the conductive plug may be formed of a metal layer. However, to form the conductive plug of a metal layer, different equipment may be required, which may increase the cost of forming such a semiconductor device.

SUMMARY OF THE INVENTION

Embodiments of the present invention include methods of forming a contact to a capacitor in a semiconductor device. A metal suicide layer is formed at a top surface of a conductive plug of the semiconductor device that is coupled to a bottom electrode of the capacitor to provide an ohmic contact therebetween. Forming a metal silicide layer may include exposing a surface of the conductive plug, depositing a metal layer of the bottom electrode on the exposed surface of the conductive plug and thermally processing the semiconductor device to react a part of the deposited metal layer and the conductive plug to form the metal silicide layer.

In other embodiments of the present invention, the conductive plug is a polysilicon doped by impurities. The method may include treating an unreacted part of the deposited metal layer to form a metallic conductive layer. The metal layer may be titanium, tantalum and/or tungsten and the metal silicide layer may be titanium silicide, tantalum silicide and/or tungsten silicide. The metal layer may also be titanium nitride, tantalum nitride and/or tungsten nitride. Depositing a metal layer and thermally processing the semiconductor device may be performed concurrently.

In further embodiments of the present invention, forming a semiconductor device including a capacitor includes forming a conductive plug through a bottom interlayer dielectric layer formed on a semiconductor substrate. The conductive plug may extend through the bottom interlayer dielectric to a predetermined region of the semiconductor substrate, such as an impurity doped region providing a source and/or drain region of a transistor formed in the substrate. A mold layer is formed on a surface of the semiconductor substrate including the conductive plug, which may be an entire surface of the semiconductor substrate. The mold layer is patterned to form an opening exposing a top surface of the conductive plug. A metal layer of a bottom electrode of the capacitor is formed in the opening. The metal layer/bottom electrode may be formed conformally. A metal silicide layer is formed at the top surface of the conductive plug to couple the metal layer to the conductive plug.

In other embodiments of the present invention, forming a metal layer of a bottom electrode and forming a metal silicide layer include depositing the metal layer over a surface of the semiconductor substrate in a region including the opening. The semiconductor device is thermally processed to react a part of the metal layer and the top surface of the conductive plug to form the metal silicide layer. A metallic conductive layer is formed over the surface of the semiconductor substrate in the region including the opening. The metallic conductive layer and un-reacted part of the metal layer on a top surface of the mold layer are removed to form the bottom electrode in the opening. Removing the metallic conductive layer and un-reacted part of the metal layer on a top surface of the mold layer to form a bottom electrode in the opening may include selectively removing the un-reacted part of the metal layer. The bottom electrode may be formed by removing the metallic conductive layer on the top surface of the mold layer.

In further embodiments of the present invention, forming the metal layer of a bottom electrode and forming a metal silicide layer include depositing the metal layer over a surface of the semiconductor substrate in a region including the opening. The semiconductor device is thermally processed to react a part of the metal layer and the top surface of the conductive plug to form the metal silicide layer. A selected further treatment process is performed on an un-reacted part of the metal layer to change the un-reacted part of the metal layer into a metallic conductive layer and the metallic conductive layer on a top surface of the mold layer is removed to form the bottom electrode in the opening.

In other embodiments of the present invention, forming the bottom electrode is followed by forming a dielectric layer on a top surface of the bottom electrode. An upper electrode is formed on the dielectric layer.

In further embodiments of the present invention, methods are provided of forming a semiconductor device including a capacitor. A conductive plug of silicon is formed through a bottom interlayer dielectric layer formed on a semiconductor substrate. A mold layer is formed over a surface of the semiconductor substrate in a region including the conductive plug. The mold layer is patterned to form an opening exposing a top surface of the conductive plug. A metal layer is formed in the opening in contact with the top surface of the conductive plug. The semiconductor device is thermally processed to react a part of the metal layer and the conductive plug to form a metal silicide layer. A conformal metallic conductive layer and a sacrificial layer are sequentially formed over the surface of the semiconductor substrate in the region including the opening. The sacrificial layer, the metallic conductive layer and an un-reacted part of the metal layer are planarized until a top surface of the mold layer is exposed to form a bottom electrode of the capacitor and a sacrificial pattern that are sequentially stacked in the opening.

In other embodiments of the present invention, forming a metal layer and thermally processing the semiconductor device to react a part of the metal layer and the top surface of the conductive plug to form a metal silicide layer are performed concurrently. Forming the metallic conductive layer may be preceded by removing an un-reacted part of the metal layer from the semiconductor substrate. Forming the bottom electrode and the sacrificial pattern may be followed by selectively removing the sacrificial pattern to expose the bottom electrode and forming a dielectric layer covering the exposed bottom electrode. An upper electrode may be formed on the dielectric layer. The sacrificial pattern may be formed of a material having an etch selectivity with respect to the bottom electrode and the mold layer.

In further embodiments of the present invention, forming the bottom electrode and the sacrificial pattern are followed by selectively removing the sacrificial pattern and a part of the mold layer to expose inner and outer walls of the bottom electrode. A dielectric layer is formed covering the exposed inner and outer walls of the bottom electrode and an upper electrode is formed on the dielectric layer. The mold layer includes an etch stopping layer and an upper interlayer dielectric layer that are sequentially stacked and the removed part of the mold layer includes the upper interlayer dielectric layer.

In other embodiments of the present invention, methods of forming a semiconductor device including a capacitor include forming a conductive plug of silicon through a bottom interlayer dielectric layer formed on a semiconductor substrate. A mold layer is formed over a surface of the semiconductor substrate in a region including the conductive plug. The mold layer is patterned to form an opening exposing a top surface of the conductive plug. A metal layer is conformally deposited over the surface of the semiconductor substrate in the region including the opening. The semiconductor device is thermally processed to react a part of the metal layer and the top surface of the conductive plug to form a metal silicide layer. A selected further treatment process is performed on an un-reacted part of the metal layer to change the un-reacted part of the metal layer into a metallic conductive layer. A sacrificial layer is formed on the metallic conductive layer to fill the opening. The sacrificial layer and the first metallic conductive layer are planarized until a top surface of the mold layer is exposed to form a bottom electrode of the capacitor and a sacrificial pattern that are sequentially stacked in the opening.

In further embodiments of the present invention, depositing a metal layer and thermally processing the semiconductor device to react a part of the metal layer and the top surface of the conductive plug to form a metal silicide layer are performed concurrently. Depositing the metal layer and thermally processing the semiconductor device to react a part of the metal layer and the top surface of the conductive plug to form a metal silicide layer may be performed in-situ, for example, in the process chamber where the metal layer is deposited. The further treatment process may be a nitrification process.

In other embodiments of the present invention, forming the sacrificial layer is preceded by forming a second metallic conductive layer over the surface of the semiconductor substrate in the region including the first metallic conductive layer. The bottom electrode is formed in the opening by planarizing the sacrificial layer, the first metallic conductive layer and the second metallic conductive layer until a top surface of the mold layer is exposed leaving a sacrificial pattern formed on the bottom electrode in the opening.

In further embodiments of the present invention, forming the bottom electrode and the sacrificial pattern formed on the bottom electrode in the opening is followed by selectively removing the sacrificial pattern to expose the bottom electrode. A dielectric layer is formed covering the exposed bottom electrode and an upper electrode is formed on the dielectric layer. The sacrificial pattern is formed of a material having an etch selectivity with respect to the bottom electrode and the mold layer.

In other embodiments of the present invention, forming the bottom electrode and the sacrificial pattern formed on the bottom electrode in the opening may be followed by selectively removing the sacrificial pattern and a part of the mold layer to expose inner and outer walls of the bottom electrode. A dielectric layer is formed covering the exposed inner and outer walls of the bottom electrode and an upper electrode is formed on the dielectric layer. The mold layer includes an etch stopping layer and an upper interlayer dielectric layer that are sequentially stacked and a removed part of the mold layer includes the upper interlayer dielectric layer.

DESCRIPTION OF THE PREFERRED EMBODIMENT

Figure 1:
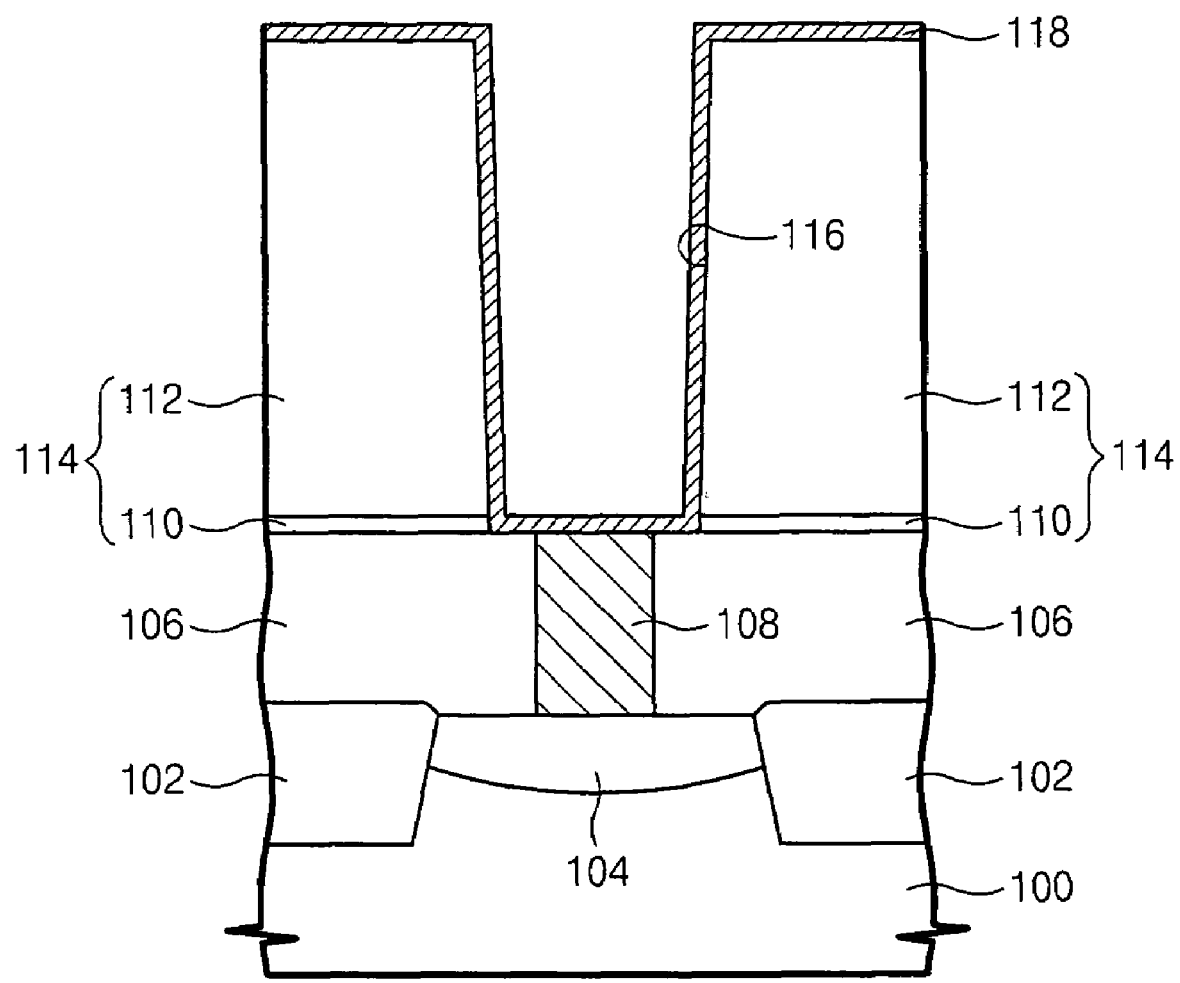
FIGS. 1, 2, 3A, 4A and 5 are cross-sectional views illustrating methods of forming an integrated circuit (semiconductor) device having a capacitor according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout the specification. As used herein the term "and/or" includes any and all combinations of one or more of the associated listed items.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section without departing from the teachings of the present invention. Like numbers refer to like elements throughout. In the Figures, a reference letter "a" may indicate a first region and another reference letter "b" may indicate a second region.

Certain embodiments of the present invention will now be further described with reference to FIGS. 1, 2, 3A, 4A and 5. FIGS. 1, 2, 3A, 4A and 5 are cross-sectional views illustrating methods of forming a semiconductor device including a capacitor according to some embodiments of the present invention. FIGS. 3B and 4B are cross-sectional views illustrating methods of forming a bottom electrode of the capacitor, where the bottom electrode has a different shape than the bottom electrode illustrated in FIGS. 3A and 4A, according to some embodiments of the present invention.

Figure 2:
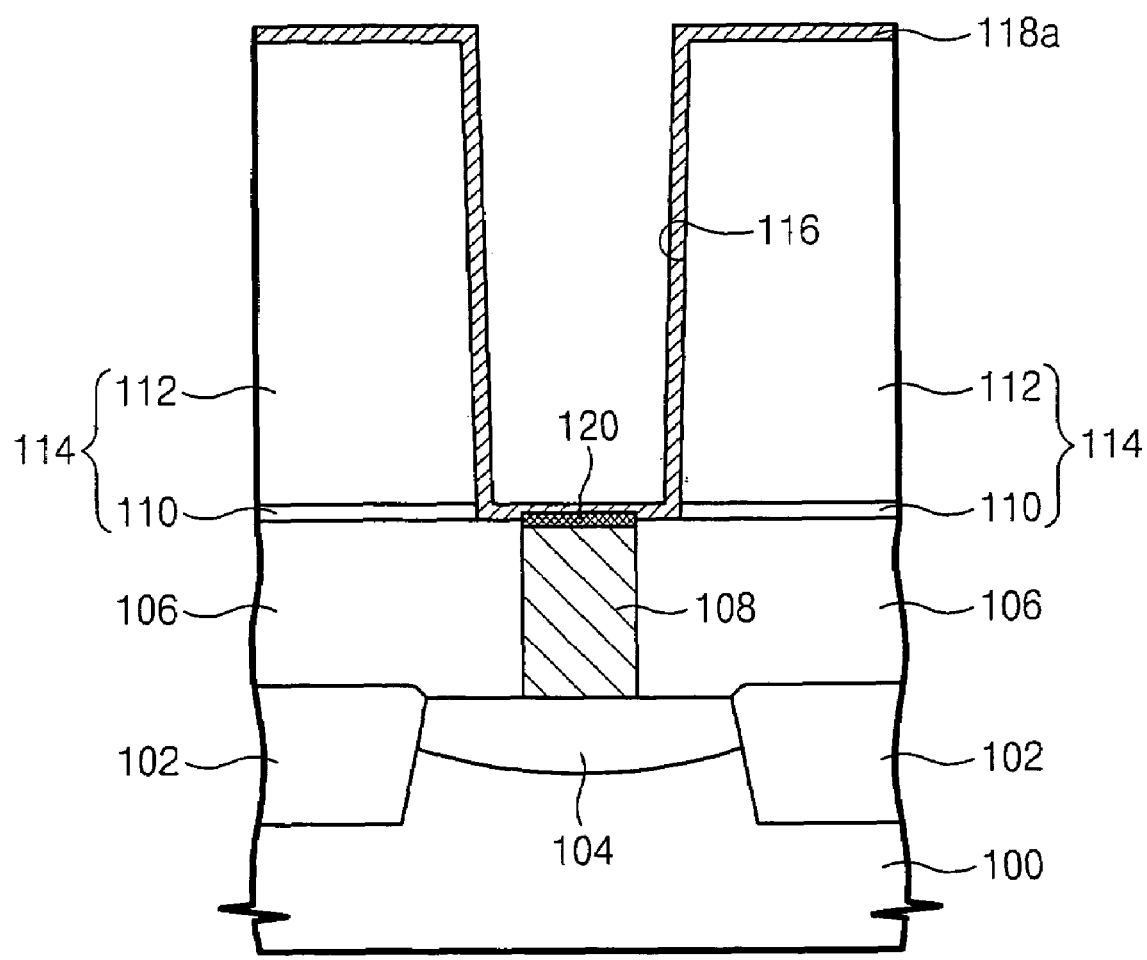

As shown in the embodiments of FIGS. 1 and 2, a field oxide layer 102 is formed in a semiconductor substrate 100 to define an active region therein. The field oxide layer 102 may be formed, for example, by a shallow trench isolation (STI) method. Impurity ions may be selectively implanted into the active region to form an impurity-doped region 104. The impurity-doped region 104 may be a source/drain region of a metal-oxide-semiconductor (MOS) transistor. The MOS transistor may be a transistor included in a unit cell of a dynamic random access memory (DRAM) and/or ferroelectric memory device.

For the embodiments illustrated in FIGS. 1 and 2, a bottom interlayer dielectric layer 106 is formed on a surface of the semiconductor substrate 100 including the impurity-doped region 104. A conductive plug 108 is formed through the bottom interlayer dielectric layer 106 that electrically connects with the impurity-doped region 104. The bottom interlayer dielectric layer 106 may be, for example, a chemical vapor deposition (CVD) deposited silicon oxide layer. The conductive plug 108 may be formed, for example, of a polysilicon doped by impurities.

In some embodiments of the present invention, a conductive pad may be formed between the conductive plug 108 and the impurity-doped region 104. The conductive pad may electrically connect the conductive plug 108 to the impurity-doped region 104 through an insulation layer that may be formed under the bottom interlayer dielectric layer 106.

For the embodiments illustrated in FIGS. 1 and 2, a mold layer 114 is formed on the surface of the semiconductor substrate 100 in the area including the conductive plug 108. The mold layer 114 may include an etch stopping layer 110 and an upper interlayer dielectric layer 112 that may be sequentially stacked. The etch stopping layer 110 may be formed of an insulation layer having an etch selectivity with respect to the upper interlayer dielectric layer 112. Furthermore, the etch stopping layer 110 may have an etch selectivity with respect to the bottom interlayer dielectric layer 106. For example, the upper interlayer dielectric layer 112 may be a silicon oxide formed by a CVDC method. The etch stopping layer 110 may be formed of a silicon nitride and/or silicon oxynitride.

The upper interlayer dielectric layer 112 and the etch stopping layer 110 may be successively patterned to form an opening 116 that exposes a top surface of the conductive plug 108. During patterning, the bottom interlayer dielectric layer 106 can be protected by the etch stopping layer 110. The opening 116 may be a circular shaped opening.

A metal layer 118 may be conformally deposited over a surface of the semiconductor substrate 100 in a region including the opening 116. During deposition of the metal layer 118, a portion of the metal layer 118 may be in contact with a top surface of the exposed conductive plug 108. A thermal process may be performed to react the exposed conductive plug 108 with a part of the metal layer 118, which may form a metal silicide layer 120 at a top surface of the exposed conductive plug 108 as illustrated in FIG. 2. The metal layer 118 may be formed by, for example, a sputtering method, a chemical vapor deposition (CVD) method and/or an atomic layer deposition (ALD) method. The metal layer 118 may be formed of one or more materials selected from the group including titanium, tantalum, tungsten, nickel and/or cobalt. The metal silicide layer 120 may be formed of one or more materials selected from the group including titanium silicide, tantalum silicide, tungsten silicide, nickel silicide and/or cobalt silicide.

The process of depositing the metal layer 118 and the process of forming the metal silicide layer 120 may be performed simultaneously, which may simplify the overall process. In other words, the metal silicide may be formed while depositing the metal layer 118 on the top surface of the exposed conductive plug 108 by supplying heat in a process chamber in which the metal layer 118 is deposited. The process of depositing the metal layer 118 and the process of forming the metal suicide layer 120 may thereby be performed in-situ. Note that an un-reacted metal layer 118a, which is not changed to the metal silicide layer 120, may remain over a remainder of the surface of the semiconductor substrate 100 in the region including an inner wall of the opening 116.

Figure 3A:
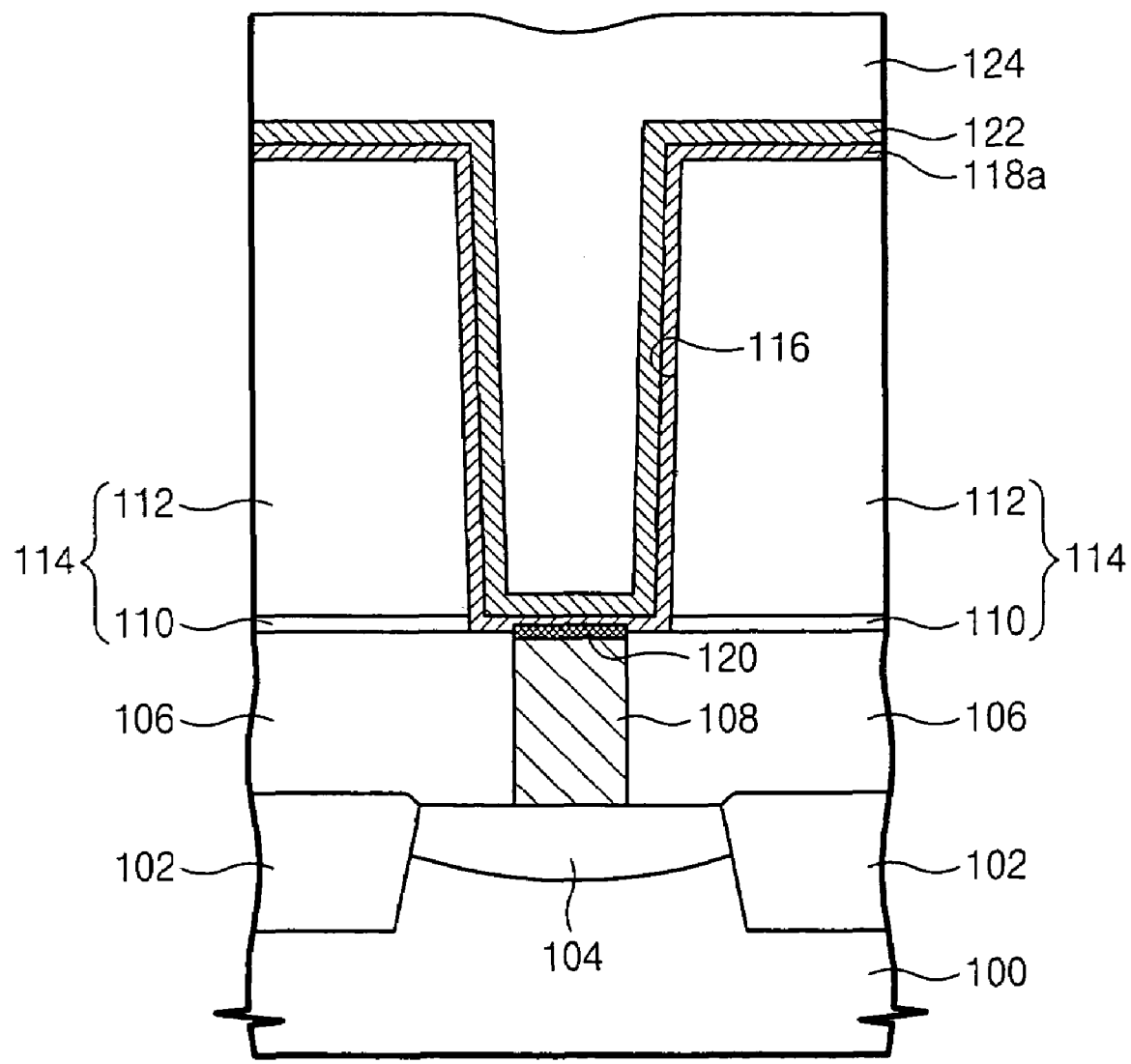
Figure 3B:
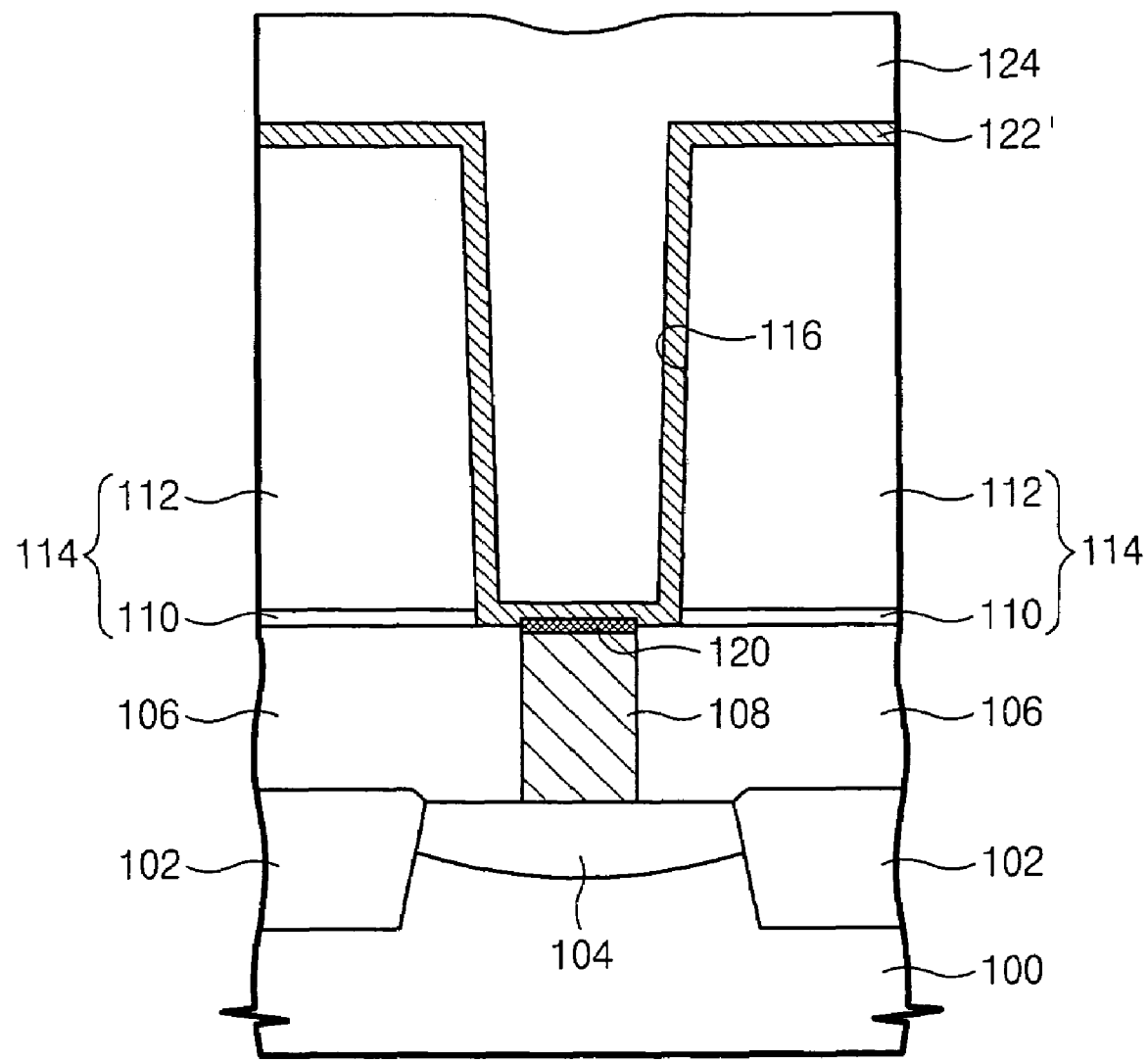
FIGS. 3B and 4B are cross-sectional views illustrating methods of forming a bottom electrode in an integrated circuit (semiconductor) device according other embodiments of the present invention.
Figure 4A:
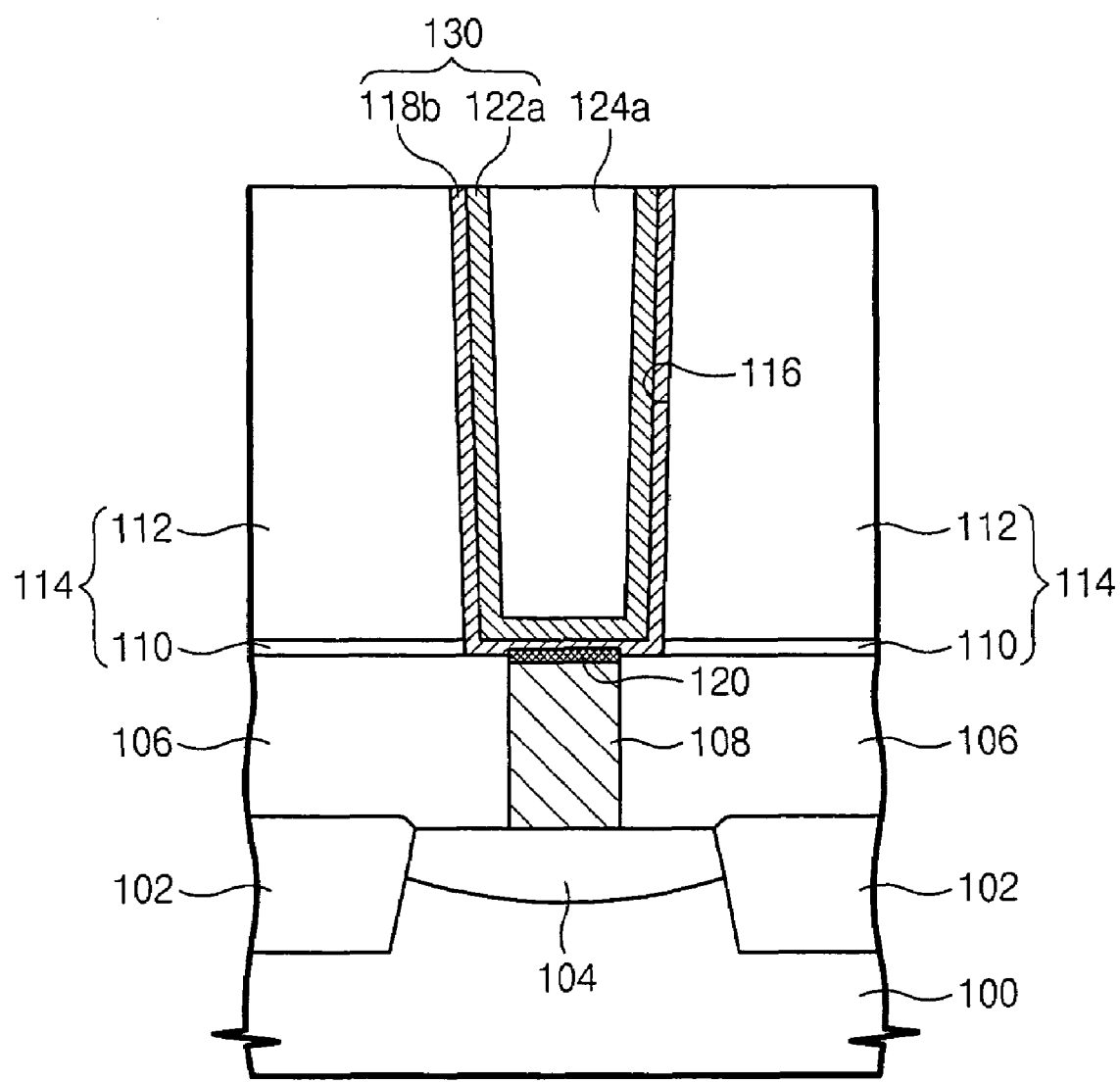
Figure 4B:
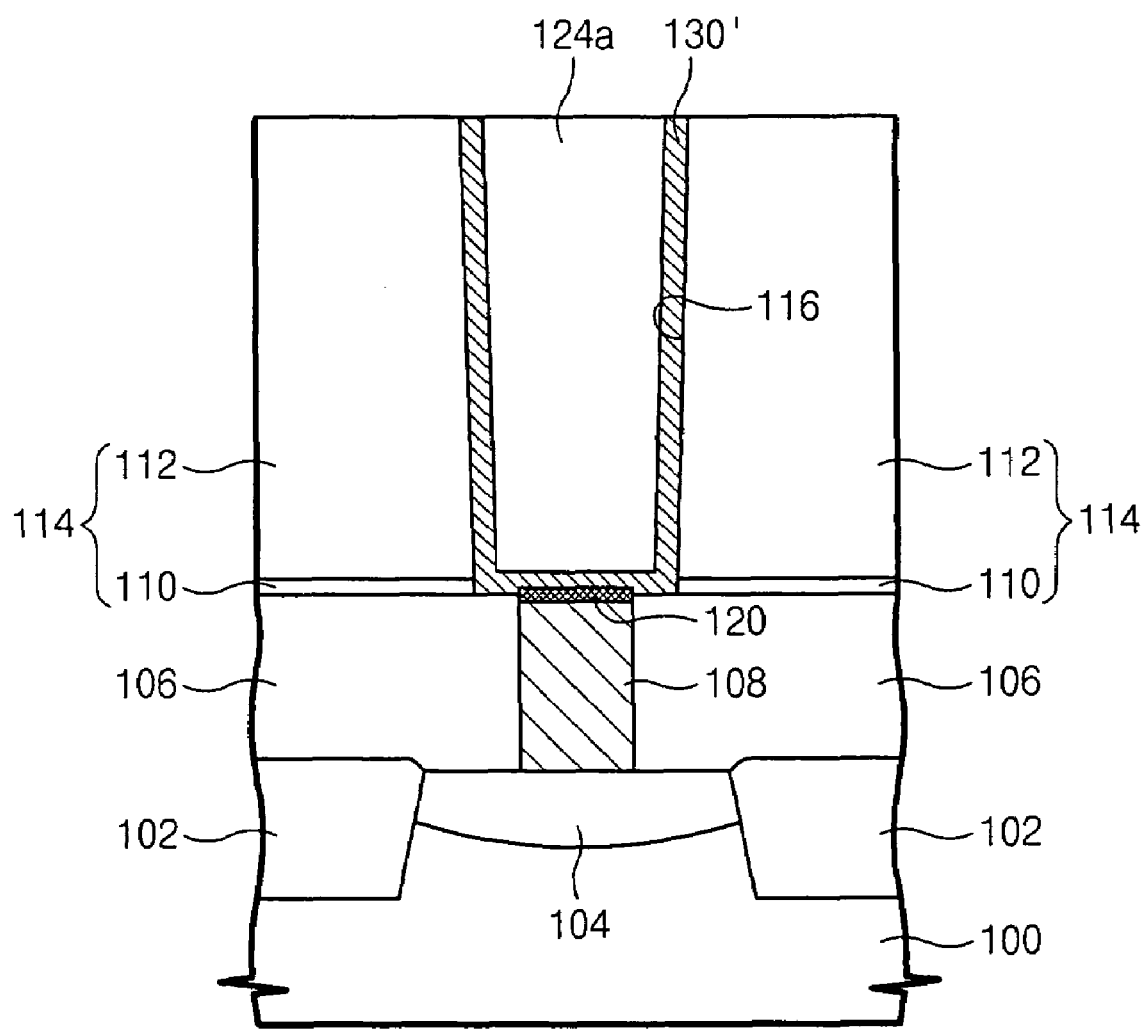

Referring now to FIGS. 3A and 4A, a metallic conductive layer 122 may be conformally formed over the surface of the semiconductor substrate 100 in a region including the un-reacted metal layer 118a. The metallic conductive layer 122 may be a metal-containing conductive layer. For example, the metallic conductive layer 122 may be a noble metal, such as ruthenium, iridium and/or platinum. The metallic conductive layer 122 may be formed of a conductive metal nitride, such as a tungsten nitride, titanium nitride and/or tantalum nitride. The metallic conductive layer 122 may also be formed of a combination layer including the noble metal layer and the conductive metal nitride layer. The metallic conductive layer 122 may be formed, for example, by a sputtering, CVD or ALD method. A sacrificial layer 124 may be formed on the metallic conductive layer 122 to fill the opening 116.

The sacrificial layer 124, the metallic conductive layer 122 and the un-reacted metal layer 118a may be planarized to expose a top surface of the mold layer 114 as illustrated in FIG. 4A. Thus, an un-reacted metal pattern 118b, a metallic conductive pattern 122a and a sacrificial pattern 124a, which are sequentially stacked, may be formed in the opening 116. The un-reacted metal pattern 118b and the metallic conductive pattern 122a may define a bottom electrode 130 of a capacitor. The bottom electrode 130, as illustrated in FIG. 4A, is in contact with the metal silicide layer 120.

Thus, the metal silicide layer 120 may be interposed between the bottom electrode 130, including a metal, and the conductive plug 108, which may be formed of polysilicon doped with impurities. The metal silicide layer 120 may thereby function as an ohmic layer. In other words, the bottom electrode 130 and the conductive plug 108 may be connected to each other through an ohmic contact defined by the metal silicide layer 120. Such an arrangement may decrease a contact resistance between the bottom electrode 130 and the conductive plug 108.

In some embodiments of the present invention, the bottom electrode 130 may be cylinder-shaped as a result of the feature(s) of the opening 100. In some alternative embodiments, the bottom electrode 130 may be formed by a different method as will now be described with reference to FIGS. 3B and 4B.

Referring now to the embodiments illustrated in FIGS. 3B and 4B, after forming the metal silicide layer 120, the un-reacted metal layer 118a (FIG. 2) may be selectively etched and removed. A metallic conductive layer 122' may then be conformally formed over a surface of the semiconductor substrate 100 in a region including the opening 116. A part of the metallic conductive layer 122' may be directly in contact with the metal silicide layer 116. In some embodiments of the present invention, the metallic conductive layer 122' may be formed of the same material as described for the metallic conductive layer 122 of the embodiments of FIGS. 3A and 4A.

As shown in FIG. 3B, a sacrificial layer 124 may be formed on the metallic conductive layer 122' to fill the opening 116. As illustrated for the embodiments shown in FIG. 4B, the sacrificial layer 124 and the metallic conductive layer 122' may be planarized until a top surface of the mold layer 114 is exposed, thereby forming a bottom electrode 130' and a sacrificial pattern 124a, which are illustrated as sequentially stacked in the opening 116. Thus, as compared to the embodiments illustrated in FIGS. 3A and 4A, the bottom electrode 130' illustrated in FIGS. 3B and 4B includes only the planarized metallic conductive layer 122'.

Figure 5:
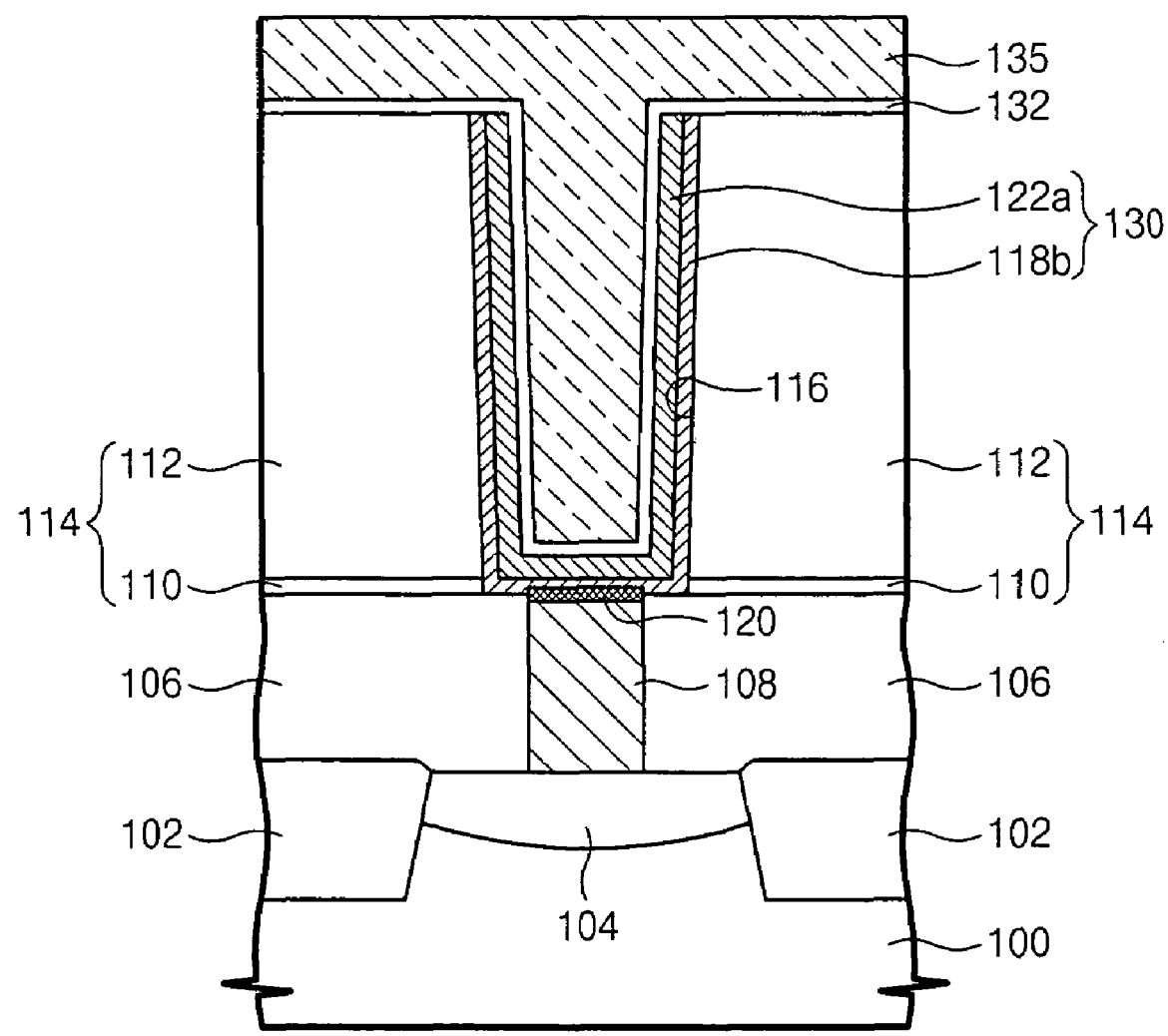

Referring now to FIGS. 4A and 5, the sacrificial pattern 124a may be selectively removed in the opening 116 to expose an inner wall and a bottom surface of the bottom electrode 130. The sacrificial pattern 124a may be formed of a material having an etch selectivity with respect to the mold layer 114 and the metallic conductive pattern 122a. For example, the sacrificial pattern 124a may be formed of a spin-on-glass (SOG) layer and/or a photoresist layer. The SOG layer may have a higher etch rate than a CVD silicon oxide.

As shown in FIG. 5, a dielectric layer 132 may be conformally formed on a surface of the semiconductor substrate 100 in a region including the exposed bottom electrode 130. An upper electrode 135 is shown formed on the dielectric layer 132. The upper electrode 135 may fill the opening 116.

The dielectric layer 132 may be formed of a high-k dielectric layer having a higher dielectric constant than an ONO layer. For example, the dielectric layer 132 may be an aluminum oxide and/or a hafnium oxide. Alternatively, the dielectric layer 132 may be a ferroelectric layer. The dielectric layer 132 may be formed of a silicon oxide and/or an ONO layer.

The upper electrode 135 may be formed of a conductive layer containing a metal. For example, the upper electrode 135 may be formed of a noble metal, such as ruthenium, iridium and/or platinum. In other embodiments, the upper electrode 135 may be formed of a conductive metal nitride, such as a tungsten nitride, titanium nitride and/or tantalum nitride. The upper electrode 135 may also be formed of a combination layer including a noble metal layer and conductive metal nitride layer. The upper electrode 135 may be formed of the same material as the bottom electrode 130.

The upper electrode 135, the dielectric layer 132 and the bottom electrode 130 may form a capacitor of an integrated circuit device. If the dielectric layer 132 is formed of a silicon oxide, an ONO layer or a high-k dielectric layer, the capacitor may be used, for example, as a data-storing unit (memory cell) of a DRAM device. If the dielectric layer 132 is formed of a ferroelectric layer, the capacitor may be used, for example, as a data-storing unit of a ferroelectric memory device.

Figure 6:
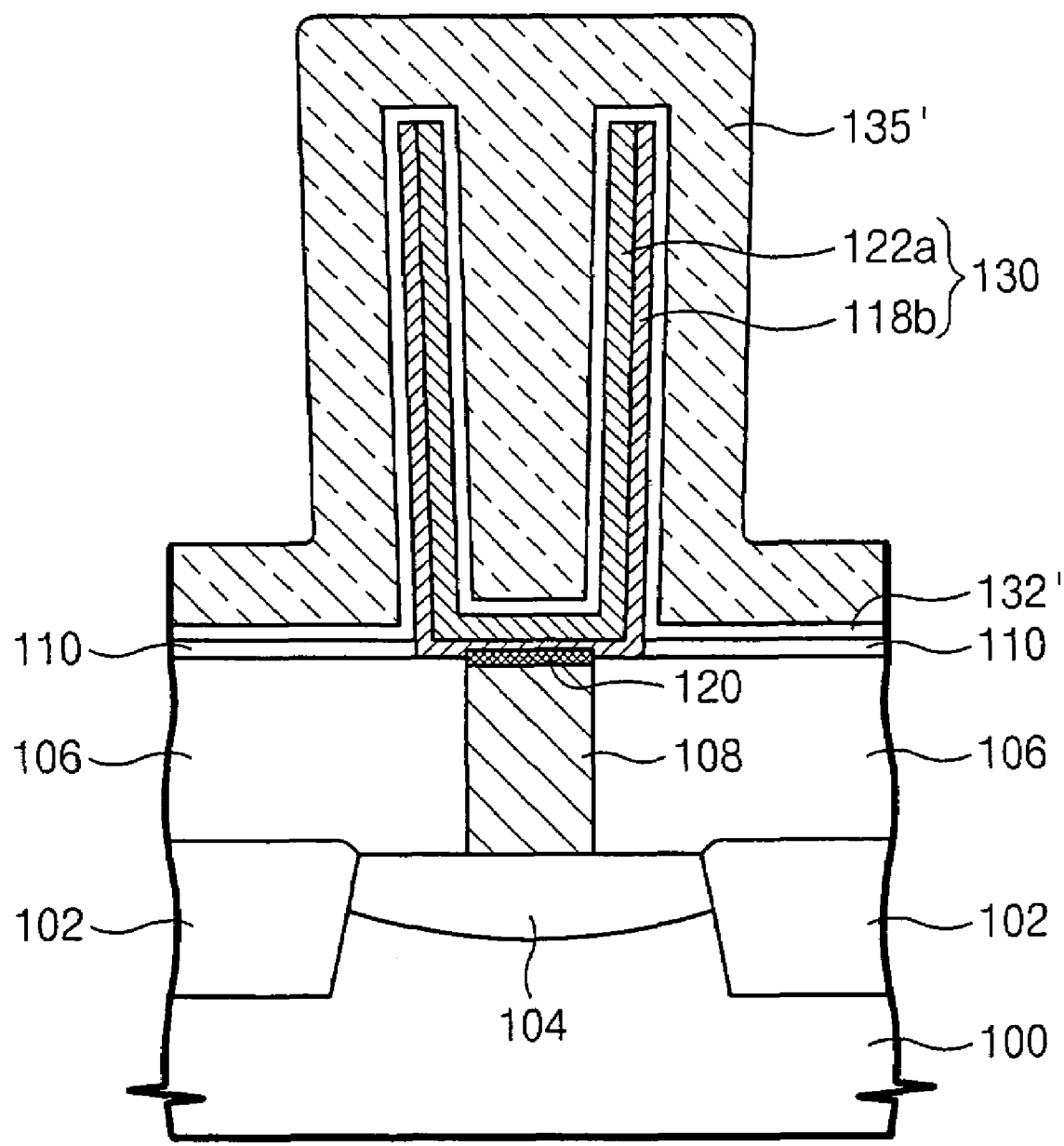
FIG. 6 is a cross-sectional view illustrating methods of forming an upper electrode in an integrated circuit (semiconductor) device according to other embodiments of the present invention.

For some embodiments of the present invention, the capacitor may be formed with a different shape as illustrated, for example, in FIG. 6. Referring to the embodiments shown in FIGS. 4A and 6, the sacrificial pattern 124a and the upper interlayer dielectric layer 112 may be selectively removed to expose an inner wall and an outer wall of the bottom electrode 130. The sacrificial pattern 124a may be formed of a material having substantially the same etch rate as the upper interlayer dielectric layer 112. For example, the sacrificial pattern 124a may be formed of a CVD silicon oxide. The sacrificial pattern 124a and the upper interlayer dielectric layer 112 may be removed, for example, by an isotropic wet etch process. The bottom interlayer dielectric layer 106 may be protected during etching by the etch stopping layer 110.

For the embodiments illustrate in FIG. 6, a dielectric layer 132' is formed on an exposed surface of the bottom electrode 130. An upper electrode 135' is formed on the dielectric layer 132'. As shown in FIG. 6, the upper electrode 135' may cover the exposed inner and outer walls of the bottom electrode 130. As a result, an exposed surface of the bottom electrode 135' may be enlarged, which may increase an overall capacitance of the capacitor. The dielectric layer 132' and the bottom electrode 135' may be formed of the same materials as described with reference to the dielectric layer 132 and the bottom electrode 135 illustrated in FIG. 5, respectively.

Further embodiments of the present invention will now be described with reference to FIGS. 7–11. For such embodiments, the semiconductor device can be formed in a manner which may be substantially similar to various aspects of the previously described embodiments. Accordingly, like reference numbers used herein refer to like components and various details related to such common aspects need not be further described herein.

Figure 7:
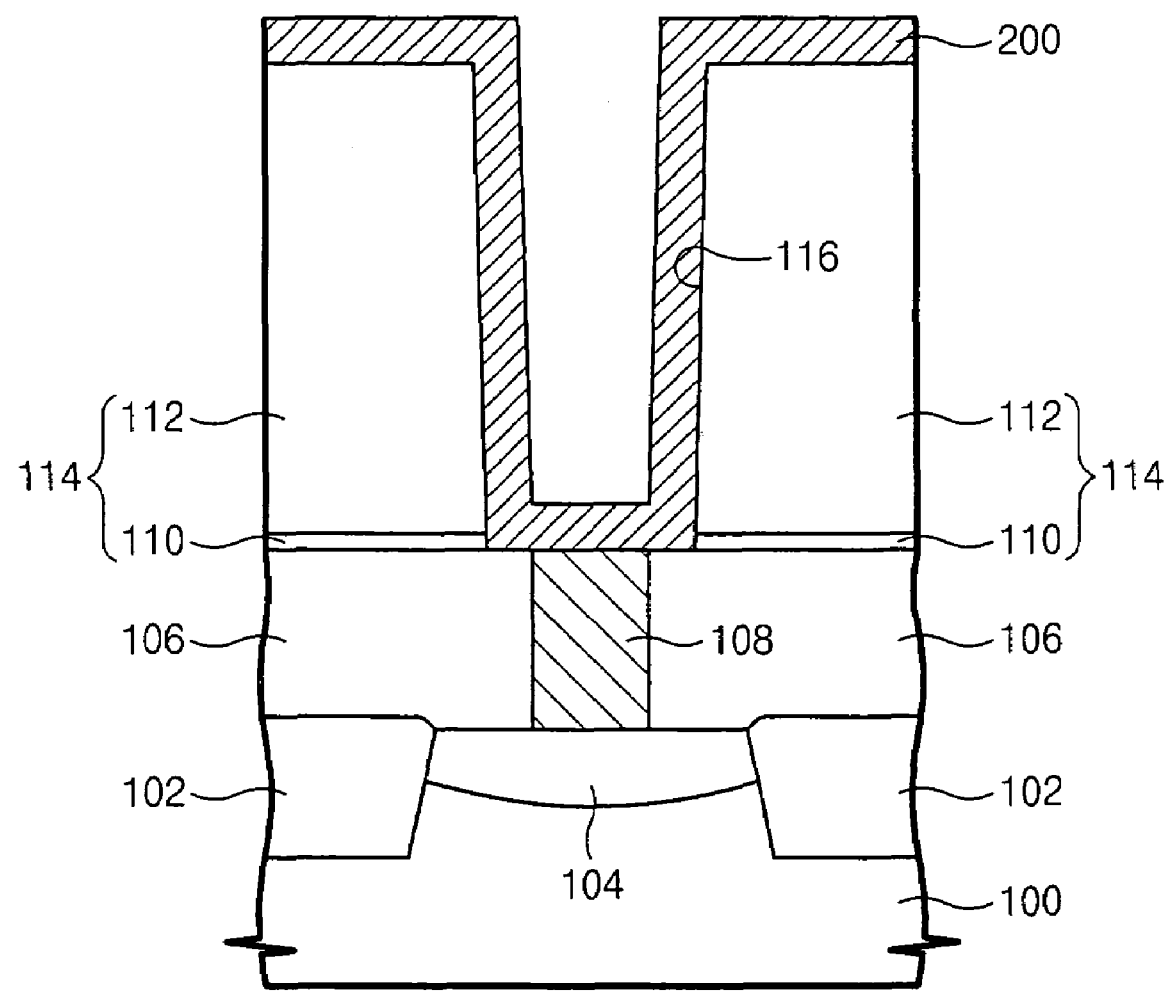
FIGS. 7 through 11 are cross-sectional views illustrating methods of forming an integrated circuit (semiconductor) device having a capacitor according to further embodiments of the present invention.
Figure 8:
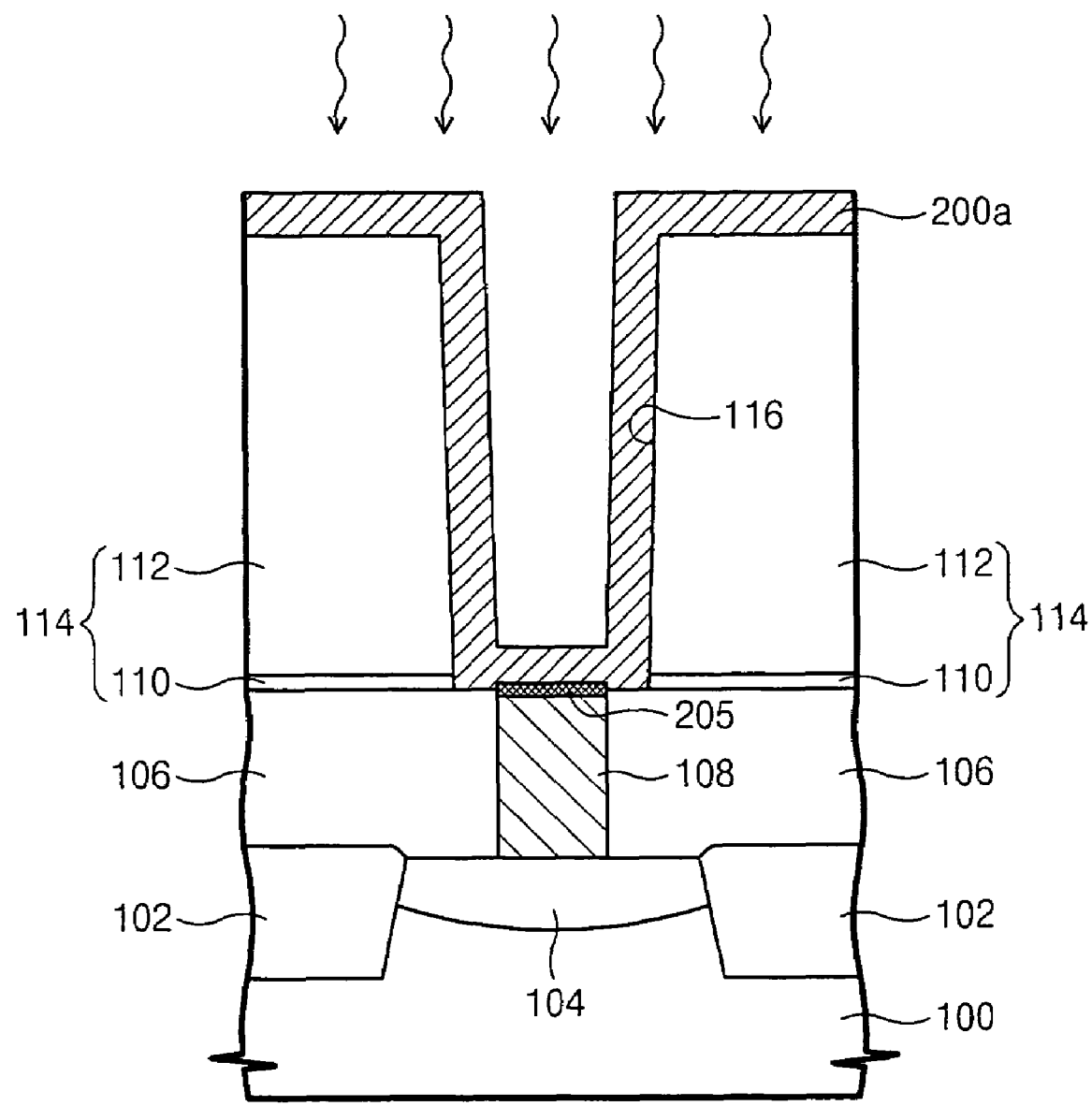
Figure 9:
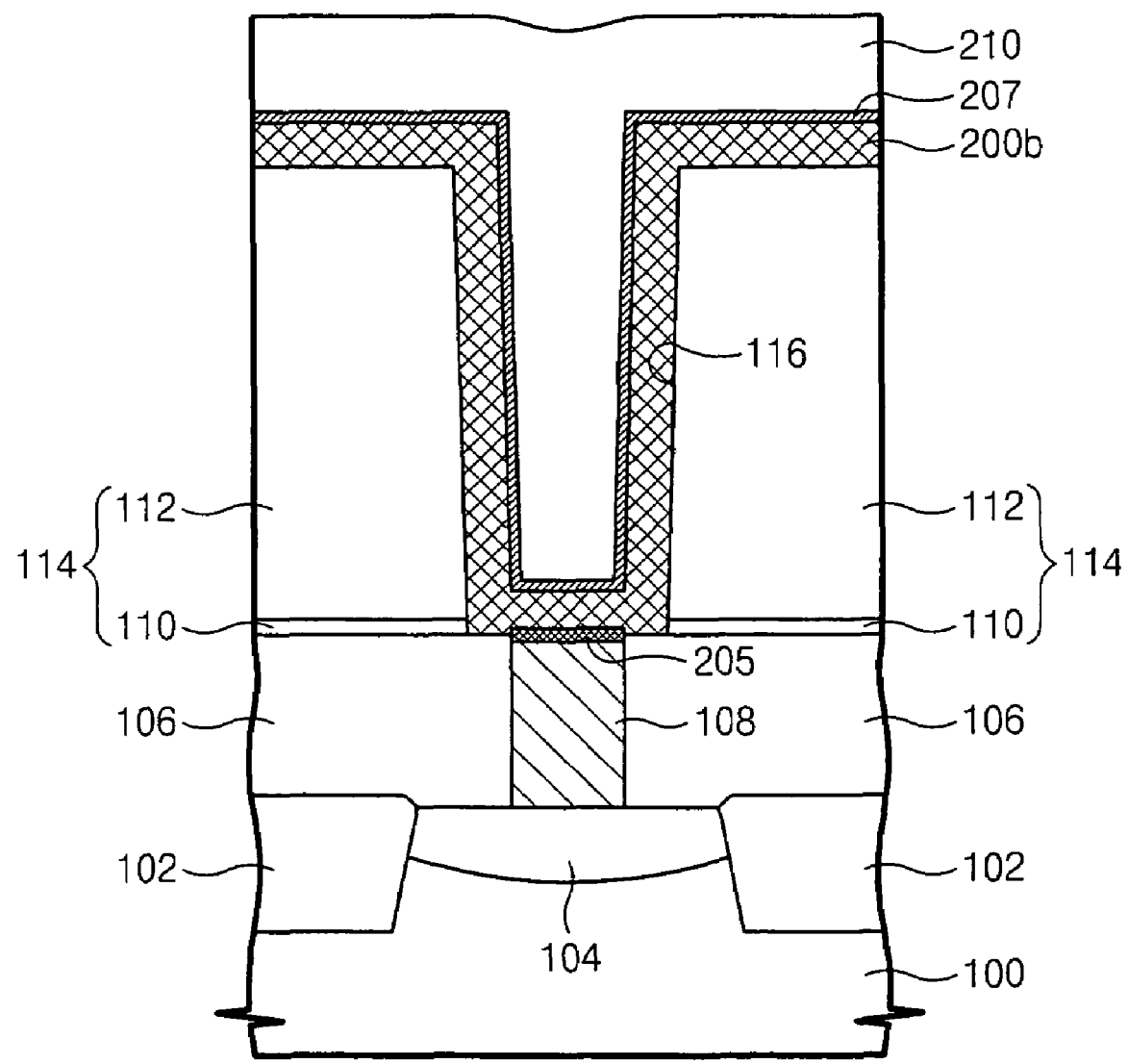

FIGS. 7 through 11 are cross-sectional views illustrating methods of forming a semiconductor device including a capacitor according to further embodiments of the present invention. As shown in FIGS. 7 through 9, a field oxide layer 102 is formed in a selected region of a semiconductor substrate 100 to define an active region. As shown in the embodiments of FIG. 7, an impurity-doped region 104 is formed in a predetermined region of the active region and a bottom interlayer dielectric layer 106 is formed on a surface of the semiconductor substrate 100 in the region including the impurity-doped region 104. A conductive plug 108 is shown formed through the bottom interlayer dielectric layer 106 to connect with the impurity-doped region 104. FIG. 7 further illustrates a mold layer 114 including an etch stopping layer 110 and an upper interlayer dielectric layer 112, which may be sequentially stacked, formed on the surface of the semiconductor substrate 100 in the region including the conductive plug 108. The mold layer 114 may be patterned to form an opening 116 exposing a top surface of the conductive plug 108.

The bottom interlayer dielectric layer 102, the etch stopping layer 110 and the upper interlayer dielectric layer 112 may be formed of the same material as those used for the like numbered elements of the embodiments previously described. In some embodiments of the present invention, the conductive plug 108 is formed of a polysilicon doped by impurities.

FIG. 7 further illustrates a metal layer 200 that may be conformally deposited on the surface of the semiconductor substrate 100 in the region including the opening 116. The metal layer 200 is illustrated as contacting with a top surface of the exposed conductive plug 108. The metal layer 200 may be formed, for example, by a sputtering, CVD or ALD method. The metal layer 200 may be thicker than the metal layer 118 illustrated in FIG. 1.

A thermal process may be performed to react a part of the metal layer 200 and the exposed conductive plug 108 to form a metal silicide layer 205 at a top surface of the exposed conductive plug 108 as illustrated in FIG. 8. Referring now to FIG. 9, a predetermined treatment process may be performed with respect to an un-reacted metal layer 200a to change the un-reacted metal layer 200a into a first metallic conductive layer 200b. The predetermined treatment process may be a nitrification process. In other words, the un-reacted metal layer 200a may be treated with a gas containing nitrogen to form the first metallic conductive layer 200b. The gas containing nitrogen may be nitrogen ($N_2$) or ammonia ($NH_3$) that is activated to form a plasma. As a result, the first metallic conductive layer 200b may be formed of a conductive metal nitride. The gas containing nitrogen can be changed into a plasma, for example, by a microwave apparatus. For a plasma generated by a microwave apparatus, the treatment process may be performed isotropically. However, the gas containing nitrogen may also be changed into a plasma using a conventional method.

The metal layer 200 may be formed of a material selected from the group including or consisting of titanium, tantalum and/or tungsten and the metal silicide layer 205 may be formed of a material selected from the group including or consisting of titanium silicide, tantalum silicide and/or tungsten silicide. The first metallic conductive layer 200b may be formed of a material selected from the group including or consisting of titanium nitride, tantalum nitride and/or tungsten nitride.

The process of depositing the metal layer 200 and the process of forming the metal silicide layer 205 illustrated in FIG. 9 may be performed simultaneously in some embodiments of the present invention. In other words, the metal silicide layer 205 may be formed while depositing the metal layer 200 on the top surface of the exposed conductive plug 108 while supplying heat to a process chamber used for depositing the metal layer 200. The metal layer 200 and the metal silicide layer 205 may thereby be formed in an in-situ manner.

The process of depositing the metal layer 200, forming the metal silicide layer 205 and forming the first metallic conductive layer 200b may also be performed in an in-situ manner. In other words, in the process chamber, after depositing the metal layer 200 and forming the metal silicide layer 205, the un-reacted metal layer 200a may be nitrified by supplying the plasma of the gas containing nitrogen into the process chamber to form the first metallic conductive layer 200b. As a result, a process time for these three processes may be effectively reduced.

Referring again to FIG. 9, a second metallic conductive layer 207 may be conformally formed on the semiconductor substrate 100 including the first metallic conductive layer 200b. The second metallic conductive layer 207 may be formed of a noble metal, such as ruthenium, iridium and/or platinum. The second metallic conductive layer 207 may be omitted in some embodiments of the present invention. A sacrificial layer 210 is shown in FIG. 9 formed on the second metallic conductive layer 207 and filling the opening 116.

Figure 10:
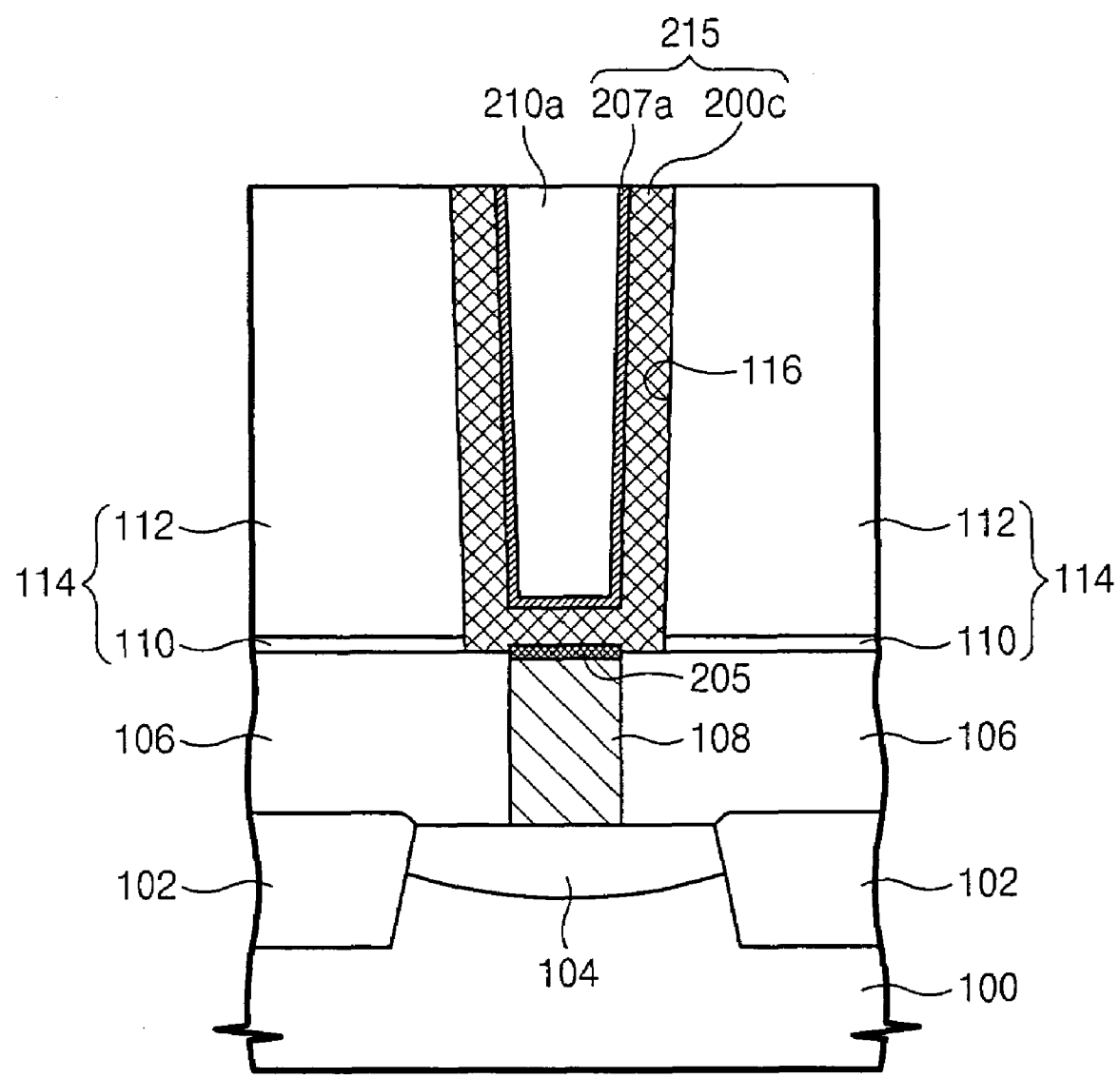
Figure 11:
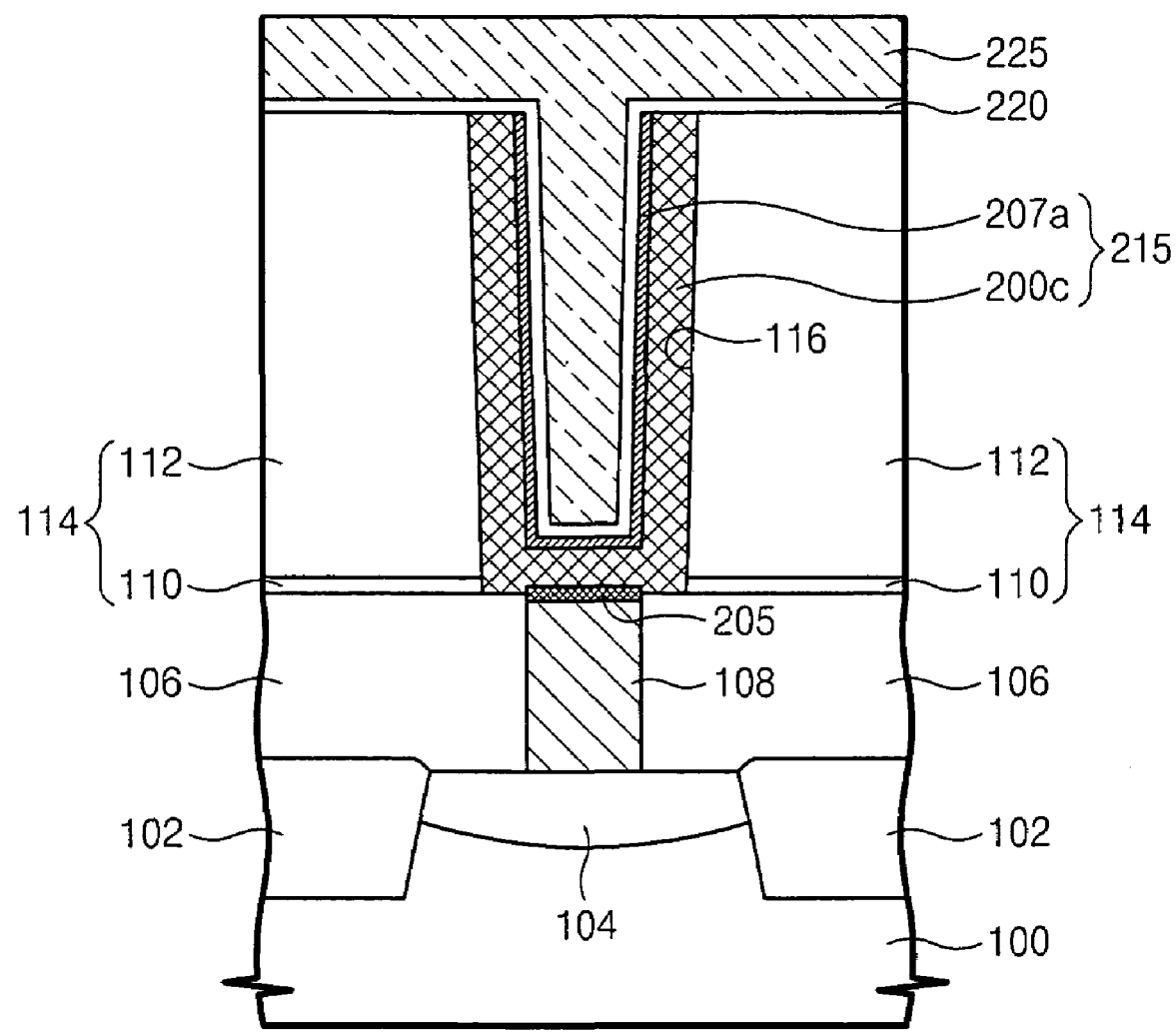

Referring now to FIGS. 10 and 11, the sacrificial layer 210 and the first and second metallic conductive layers 200b and 207 may be planarized until a top surface of the mold layer 114 is exposed to form a bottom electrode 215 and a sacrificial pattern 210a, which may be sequentially stacked in the opening 116. The bottom electrode 215 may include a first metallic conductive pattern 200c and a second metallic conductive pattern 207a, which may be sequentially stacked. In embodiments where the second metallic conductive layer 207 is omitted, the bottom electrode 215 may include only the first metallic conductive pattern 200c. The bottom electrode 215 may be, for example, cylinder-shaped. The bottom electrode 215 and the conductive plug 108 may be connected to each other through, effectively, an ohmic contact as a result of the metal silicide layer 205. Therefore, it may be possible to decrease a contact resistance between the bottom electrode 215 and the conductive plug 108.

As shown in FIG. 11, the sacrificial pattern 210a may be selectively removed to expose an inner wall of the bottom electrode 215. The sacrificial pattern 210a may be formed of a material having an etch selectivity with respect to the bottom electrode 215 and the mold layer 114. For example, the sacrificial pattern 210a may be formed of an SOG layer and/or a photoresist layer.

A dielectric layer 220 is illustrated in FIG. 11 formed on a surface of the semiconductor substrate 100 in a region including a surface of the exposed bottom electrode 215. An upper electrode 225 is illustrated formed on the dielectric layer 220. The dielectric layer 220 may be formed, for example, of a high-k dielectric layer having a higher dielectric constant than an ONO layer. For example, the dielectric layer 200 may be an aluminum oxide and/or a hafnium oxide. The upper electrode 225 may be formed of a conductive layer containing a metal. For example, the upper electrode 225 may be formed of a noble metal, such as ruthenium, iridium and/or platinum. In other embodiments of the present invention, the upper electrode 225 may be formed of a conductive metal nitride, such as a tungsten nitride, titanium nitride and/or tantalum nitride. In yet other embodiments of the present invention, the upper electrode 225 may be formed as a combination layer including the noble metal layer and the conductive metal nitride layer.

Figure 12:
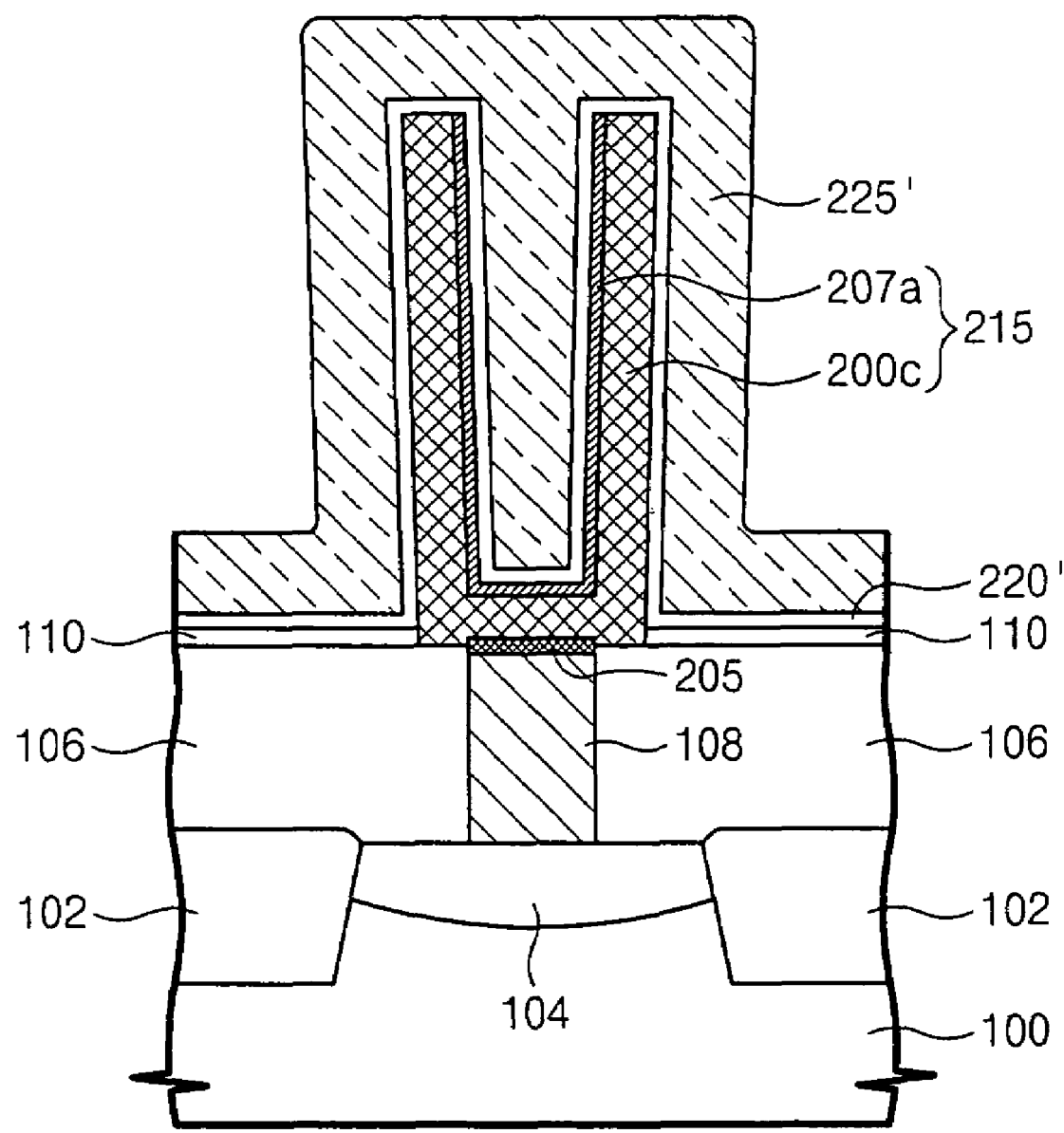
FIG. 12 is a cross-sectional view illustrating methods of forming an upper electrode in an integrated circuit (semiconductor) device according to other embodiments of the present invention.

Embodiments of the present invention including a different shape dielectric layer 200' and upper electrode 225' will now be described with reference to FIG. 12. FIG. 12 is a cross-sectional view illustrating methods of forming an upper electrode having such a different shape in a semiconductor device. As shown in FIG. 12, the sacrificial pattern 210a (FIG. 10) and the upper interlayer dielectric layer 112 (FIG. 10) have been removed to expose inner and outer walls of the bottom electrode 215. The sacrificial pattern 210a may be formed of a material having the same etch rate as that of the upper interlayer dielectric layer 112. For example, the sacrificial pattern 210a may be formed of a CVD silicon oxide.

As shown for the embodiments of FIG. 12, a dielectric layer 220' is formed on a surface of the semiconductor substrate 100 in a region including the exposed bottom electrode 215 and an upper electrode 225' is formed on the dielectric layer 220'. A capacitor including the bottom electrode 215, the dielectric layer 220' and the upper electrode 225' may have increased capacitance as a result of an enlarged overlap area between the upper electrode 225' and the bottom electrode 215.

As described above, according to some embodiments of the present invention, a mold layer is patterned to form an opening exposing a top surface of a conductive plug. The conductive plug may be formed of a polysilicon doped by impurities. A metal layer may be conformally deposited thereon and a thermal process may be performed to form a metal silicide layer at a top surface of the exposed conductive plug. A bottom electrode containing a metal may be formed to connect with the metal silicide layer in the opening. The bottom electrode and the conductive plug may, thereby, be connected to each other by an ohmic contact provided by the metal silicide layer. As a result, it may be possible to decrease a contact resistance between the bottom electrode and the conductive plug.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method of forming a contact to a capacitor in a semiconductor device, comprising:
    forming a conductive plug of the semiconductor device;
    forming a metal layer of a bottom electrode of the capacitor on a top surface of the conductive plug;
    forming a metal silicide layer at the top surface of the conductive plug at an interface of the conductive plug and the metal layer, while retaining a conductive layer of the metal layer of the bottom electrode extending across the metal silicide layer, to provide an ohmic contact between the conductive plug and the bottom electrode; and then
    nitrifying an unreacted part of the deposited metal layer to form a metallic conductive layer.

2. The method of claim 1 wherein forming a metal silicide layer comprises:
    exposing a surface of the conductive plug;
    depositing the metal layer of the bottom electrode on the exposed surface of the conductive plug; and
    thermally processing the semiconductor device to react a part of the deposited metal layer and the conductive plug to form the metal silicide layer.

3. The method of claim 2 wherein the conductive plug comprises a polysilicon doped by impurities.

4. The method of claim 2 wherein depositing a metal layer and thermally processing the semiconductor device are performed concurrently.

5. A method of forming a semiconductor device including a capacitor, comprising:
    forming a conductive plug through a bottom interlayer dielectric layer formed on a semiconductor substrate;
    forming a mold layer over a surface of the semiconductor substrate including the conductive plug;
    patterning the mold layer to form an opening exposing a top surface of the conductive plug;
    forming a metal layer of a bottom electrode of the capacitor in the opening; and
    forming a metal silicide layer at the top surface of the conductive plug at an interface of the conductive plug and the metal layer, while retaining a conductive layer of the metal layer of the bottom electrode extending across the metal silicide layer, to couple the metal layer to the conductive plug;
    wherein forming the metal layer of the bottom electrode includes removing a portion of the metal layer from a top surface of the mold layer after forming the metal silicide layer.

6. The method of claim 5, wherein forming a metal layer of a bottom electrode and forming a metal silicide layer comprise:
    depositing the metal layer over a surface of the semiconductor substrate in a region including the opening;
    thermally processing the semiconductor device to react at least a part of the metal layer and the top surface of the conductive plug to form the metal silicide layer;
    forming a metallic conductive layer over the surface of the semiconductor substrate in the region including the opening; and
    wherein removing the portion of the metal layer includes removing the metallic conductive layer and un-reacted part of the metal layer on a top surface of the mold layer to form the bottom electrode in the opening.

7. The method of claim 5, wherein forming a metal layer of a bottom electrode and forming a metal silicide layer comprise:

depositing the metal layer over a surface of the semiconductor substrate in a region including the opening;

thermally processing the semiconductor device to react a part of the metal layer and the top surface of the conductive plug to form the metal suicide layer;

performing a selected further treatment process on an un-reacted part of the metal layer to change the un-reacted part of the metal layer into a metallic conductive layer; and wherein removing the portion of the metal layer includes removing the metallic conductive layer on a top surface of the mold layer to form the bottom electrode in the opening.

8. The method of claim 5, wherein forming the bottom electrode is followed by:

forming a dielectric layer on a top surface of the bottom electrode; and forming an upper electrode on the dielectric layer.

9. A method of forming a semiconductor device including a capacitor, comprising:

forming a conductive plug of silicon through a bottom interlayer dielectric layer formed on a semiconductor substrate;

forming a mold layer over a surface of the semiconductor substrate in a region including the conductive plug;

patterning the mold layer to form an opening exposing a top surface of the conductive plug;

forming a metal layer of a bottom electrode of the capacitor in the opening in contact with the top surface of the conductive plug;

thermally processing the semiconductor device to react a part of the metal layer and the conductive plug to form a metal suicide layer at an interface of the conductive plug and the metal layer while retaining a conductive layer of the metal layer of the bottom electrode extending across the metal silicide layer;

sequentially forming a conformal metallic conductive layer and a sacrificial layer over the surface of the semiconductor substrate in the region including the opening; and planarizing the sacrificial layer, the metallic conductive layer and an un-reacted part of the metal layer until a top surface of the mold layer is exposed to form the bottom electrode of the capacitor and a sacrificial pattern that are sequentially stacked in the opening.

10. The method of claim 9, wherein forming a metal layer and thermally processing the semiconductor device to react a part of the metal layer and the conductive plug to form a metal silicide layer are performed concurrently.

11. The method of claim 9, wherein forming the metallic conductive layer is preceded by removing an un-reacted part of the metal layer from the semiconductor substrate.

12. The method of claim 9, wherein forming the bottom electrode and the sacrificial pattern are followed by:

selectively removing the sacrificial pattern to expose the bottom electrode;

forming a dielectric layer covering the exposed bottom electrode; and forming an upper electrode on the dielectric layer; and wherein the sacrificial pattern is formed of a material having an etch selectivity with respect to the bottom electrode and the mold layer.

13. The method of claim 9, wherein forming the bottom electrode and the sacrificial pattern are followed by:

selectively removing the sacrificial pattern and a part of the mold layer to expose inner and outer walls of the bottom electrode;

forming a dielectric layer covering the exposed inner and outer walls of the bottom electrode; and forming an upper electrode on the dielectric layer; and wherein the mold layer includes an etch stopping layer and an upper interlayer dielectric layer that are sequentially stacked and the removed part of the mold layer includes the upper interlayer dielectric layer.

14. A method of forming a semiconductor device including a capacitor, comprising:

forming a conductive plug of silicon through a bottom interlayer dielectric layer formed on a semiconductor substrate;

forming a mold layer over a surface of the semiconductor substrate in a region including the conductive plug;

patterning the mold layer to form an opening exposing a top surface of the conductive plug;

conformally depositing a metal layer over the surface of the semiconductor substrate in the region including the opening;

thermally processing the semiconductor device to react a part of the metal layer and the conductive plug to form a metal silicide layer;

performing a selected further treatment process on an un-reacted part of the metal layer to change the un-reacted part of the metal layer into a metallic conductive layer;

forming a sacrificial layer on the metallic conductive layer to fill the opening; and planarizing the sacrificial layer and the first metallic conductive layer until a top surface of the mold layer is exposed to form a bottom electrode of the capacitor and a sacrificial pattern that are sequentially stacked in the opening.

15. The method of claim 14, wherein depositing a metal layer and thermally processing the semiconductor device to react a part of the metal layer and the conductive plug to form a metal silicide layer are performed concurrently.

16. The method of claim 14, wherein depositing the metal layer and thermally processing the semiconductor device to react a part of the metal layer and the conductive plug to form a metal silicide layer are performed in-situ.

17. The method of claim 14, wherein the further treatment process comprises a nitrification process.

18. The method of claim 14, wherein the metal layer comprises titanium, tantalum and/or tungsten and wherein the metal suicide layer comprises titanium silicide, tantalum silicide and/or tungsten silicide and wherein the first metallic conductive layer comprises titanium nitride, tantalum nitride and/or tungsten nitride.

19. The method of claim 14, wherein forming the sacrificial layer is preceded by forming a second metallic conductive layer over the surface of the semiconductor substrate in the region including the first metallic conductive layer and wherein the bottom electrode is formed in the opening by planarizing the sacrificial layer, the first metallic conductive layer and the second metallic conductive layer until a top surface of the mold layer is exposed leaving a sacrificial pattern formed on the bottom electrode in the opening.

20. The method of claim 14, wherein forming the bottom electrode and the sacrificial pattern formed on the bottom electrode in the opening is followed by:

selectively removing the sacrificial pattern to expose the bottom electrode;

forming a dielectric layer covering the exposed bottom electrode; and forming an upper electrode on the dielectric layer, and wherein the sacrificial pattern is formed of a material having an etch selectivity with respect to the bottom electrode and the mold layer.

21. The method of claim 14, wherein forming the bottom electrode and the sacrificial pattern formed on the bottom electrode in the opening is followed by:

selectively removing the sacrificial pattern and a part of the mold layer to expose inner and outer walls of the bottom electrode;

forming a dielectric layer covering the exposed inner and outer walls of the bottom electrode; and forming an upper electrode on the dielectric layer, and wherein the mold layer includes an etch stopping layer and an upper interlayer dielectric layer that are sequentially stacked and a removed part of the mold layer includes the upper interlayer dielectric layer.

* * * * *